(12) United States Patent
Choi et al.

(10) Patent No.: US 8,702,867 B2
(45) Date of Patent: Apr. 22, 2014

(54) GAS DISTRIBUTION PLATE AND SUBSTRATE TREATING APPARATUS INCLUDING THE SAME

(75) Inventors: Jae-Wook Choi, Gyeonggi-do (KR); Chan-Ho Park, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 503 days.

(21) Appl. No.: 12/497,697

(22) Filed: Jul. 5, 2009

(65) Prior Publication Data

US 2010/0006031 A1 Jan. 14, 2010

(30) Foreign Application Priority Data

Jul. 8, 2008 (KR) .................. 10-2008-0065816
Jun. 16, 2009 (KR) .................. 10-2009-0053463

(51) Int. Cl.
*C23C 16/455* (2006.01)
*H01L 21/306* (2006.01)
*C23F 1/00* (2006.01)
*C23C 16/06* (2006.01)
*C23C 16/22* (2006.01)

(52) U.S. Cl.
USPC . 118/715; 118/728; 156/345.33; 156/345.34; 156/345.51

(58) Field of Classification Search
CPC ........ C23C 16/455; C23F 1/00; H01L 21/306

USPC .................. 118/715; 156/345.33–345.34
See application file for complete search history.

(56) References Cited

U.S. PATENT DOCUMENTS

2002/0011215 A1* 1/2002 Tei et al. ............... 118/723 MW
2006/0228496 A1* 10/2006 Choi et al. ..................... 427/569

FOREIGN PATENT DOCUMENTS

CN 101018886 8/2007

* cited by examiner

*Primary Examiner* — Rudy Zervigon (57) ABSTRACT

A gas distribution plate that is installed in a chamber providing a reaction space and supplies a reaction gas onto a substrate placed on a substrate placing plate, wherein the gas distribution plate includes: first and second surfaces opposing to each other, wherein the second surface faces the substrate placing plate and has a recess shape; and a plurality of injection holes each including: an inflow portion that extends from the first surface toward the second surface; a diffusing portion that extends from the second surface toward the first surface; and an orifice portion between the inflow portion and the diffusing portion, wherein the plurality of inflow portions of the plurality of injection holes decrease in gas path from edge to middle of the gas distribution plate, and wherein the plurality of diffusing portions of the plurality of injection holes have substantially the same gas path.

20 Claims, 9 Drawing Sheets

FIG. 1

RELATED ART

GAS DISTRIBUTION PLATE AND SUBSTRATE TREATING APPARATUS INCLUDING THE SAME

The present invention claims benefit of Korean Patent Application Nos. 10-2008-0065816, and 10-2009-0053463 filed in Korea on Jul. 8, 2008, and Jun. 16, 2009, respectively, which are hereby incorporated by reference.

BACKGROUND OF THE INVENTION

1. Field of the Invention

The present invention relates to a gas distribution plate and a substrate treating apparatus including the same.

2. Background of the Related Art

In general, semiconductor devices, display devices, solar cells, and the like are manufactured through various processes for substrates. For example, a thin film deposition process and a photolithography process and an etching process are performed several times to form circuit patterns on the substrate, and additional processes such as a cleaning process, an attaching process, a cutting process and the like are performed. Among these processes, the deposition process and the etching process are performed in a chamber type substrate treating apparatus. To do this, a reaction gas is supplied onto the substrate through a gas distribution plate of the apparatus, thus a thin film is deposited or etched on the substrate.

Figure 1:
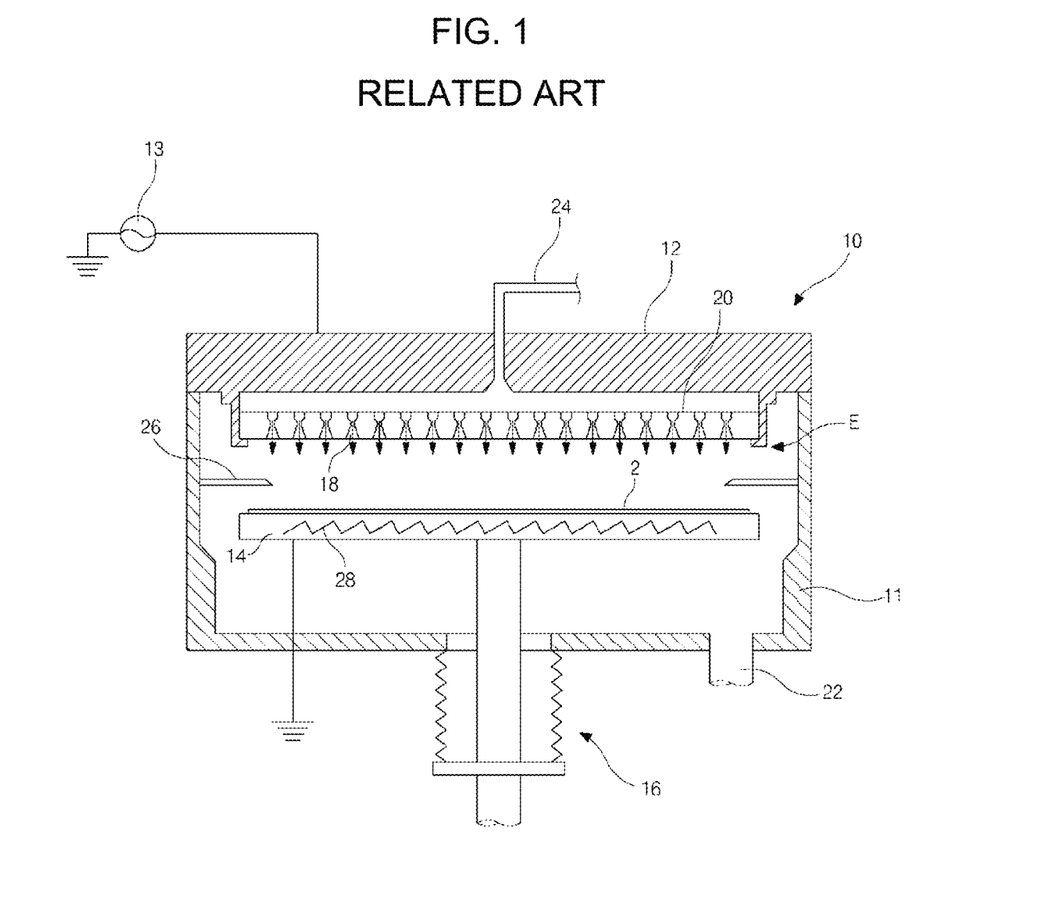
FIG. 1 is a cross-sectional view illustrating a substrate treating apparatus according to the related art.
Figure 2:
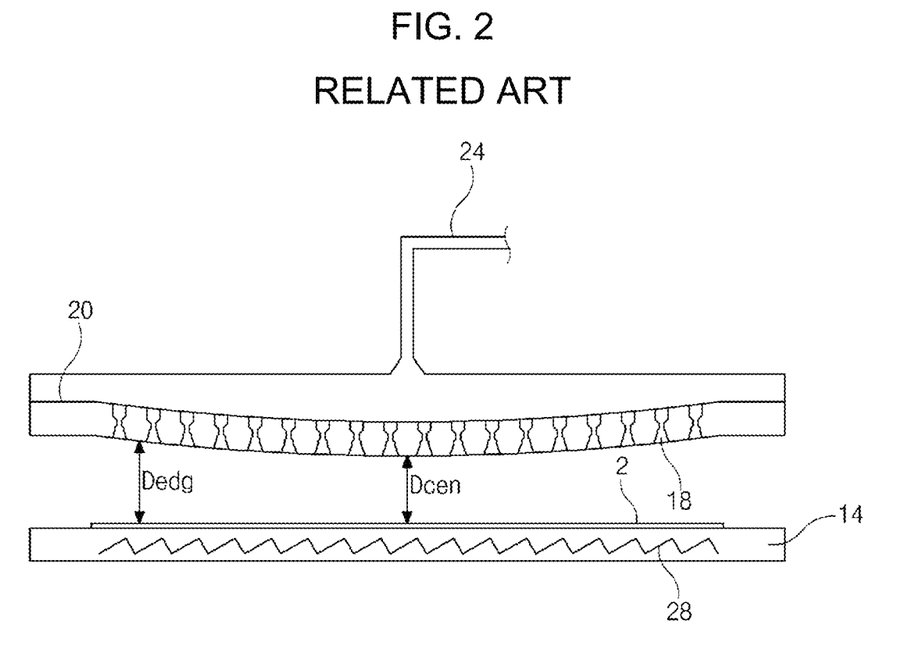
FIG. 2 is a cross-sectional view illustrating deformation of a gas distribution plate according to the related art.

FIG. 1 is a cross-sectional view illustrating a substrate treating apparatus according to the related art, and FIG. 2 is a cross-sectional view illustrating deformation of a gas distribution plate according to the related art.

Referring to FIG. 1, a PECVD (plasma enhanced chemical vapor deposition) apparatus is generally used as the substrate treating apparatus 10. The substrate treating apparatus 10 includes a chamber 11 including a chamber lid 12 to provide a reaction space E therein. A substrate 2 is placed on a substrate placing plate 14, and a heater 28 is installed in the substrate placing plate 14. A gas distribution plate 20 injects a reaction gas toward the substrate placing plate 14. An edge frame 26 is fitted into an inner wall of the chamber 11 and functions to prevent deposition of thin film at peripheral regions of the substrate 2. A gas supply pipe 24 supplies the reaction gas to the gas distribution plate 20. An exhaust port 22 functions to exhaust the reaction gas of the reaction space E and to adjust vacuum of the reaction space E.

The chamber lid 12 connected to a RF (radio frequency) voltage source 13, and the substrate placing plate 14 connected to a ground terminal function as an upper electrode and a lower electrode, respectively. Accordingly, the chamber lid 12 and the substrate placing plate 14 function to activate the reaction gas when the reaction gas flows into the reaction space E.

The gas distribution plate 20 includes a plurality of injection holes 18. The gas distribution plate 20 is coupled with the chamber lid 12, and an accommodating space is formed between the gas distribution plate 20 and the chamber lid 12 and functions to accommodate the reaction gas supplied from the gas supply pipe 24. The substrate placing plate 14 moves down to load/unload the substrate 2, and moves up to form or etch a thin film on the substrate 2. In other words, the substrate placing plate 14 is configured such that it moves up and down.

The edge frame 26 is fixed into the inner wall of the chamber 11. The edge frame 26 shields the peripheral regions of the substrate 2 when the substrate placing plate 14 moves up, thus formation of thin film at the peripheral regions of the substrate 2 is prevented.

The gas supply pipe 24 is installed such that it passes through a middle portion of the chamber lid 12. A baffle (not shown) is installed at a location of the accommodating space corresponding to the gas supply pipe 24, and functions to uniformly distribute the reaction gas from the gas supply pipe 24. The exhaust port 22 is coupled with a vacuum pump (not shown) so that the reaction gas of the reaction space E is exhausted or vacuum of the reaction space E is adjusted.

The thin film deposited on the substrate 2 is required to have a uniform thickness and property all over the substrate 2. The uniform thickness and property is influenced by uniform supply of the reaction gas onto the substrate 2 and uniformity of plasma generated between the gas distribution plate 20 and the substrate placing plate 14. A dominant one out of factors influencing the uniform supply of the reaction gas and the uniformity of plasma is uniformity of distance between the gas distribution plate 20 and the substrate placing plate 14. In other words, when the distance between the gas distribution plate 20 and the substrate placing plate 14 is entirely uniform, uniformity of the thin film on the substrate 2 is obtained.

The gas distribution plate 20 before the process of depositing the thin film on the substrate 2 has a status in parallel with the substrate placing plate 14, as shown in FIG. 1. However, when the process of depositing the thin film on the substrate 2 is performed, a temperature of the reaction space E is required to increase to a predetermined temperature for decomposition and reaction of the reaction gas. Because of the temperature increase, the gas distribution plate 20 attached to the chamber lid 12 is expanded. When the gas distribution plate 20 is expanded, the gas distribution plate 20 weighs down under the weight of the gas distribution plate 20, as shown in FIG. 2. Accordingly, distance between the gas distribution plate 20 and the substrate placing plate 14 decrease from edge to middle. In other words, the distance Dedg at edge is more than the distance Dcen at middle.

Furthermore, as the substrate 2 and the gas distribution plate 20 increase in size for a large-sized display device or solar cell, the weigh-down deformation of the gas distribution plate 20 becomes more serious. Accordingly, density of the reaction gas supplied onto the substrate 2 and density of plasma between the gas distribution plate 20 and the substrate placing plate 14 are not uniform, thus deposition uniformity of the thin film on the substrate 2 is difficult to obtain. Further, when the thin film on the substrate 2 is etched, etching uniformity is difficult to obtain. Therefore, uniformity of the thin film is degraded and production efficiency is reduced.

SUMMARY OF THE INVENTION

Accordingly, the present invention is directed to a gas distribution plate and a substrate treating apparatus including the same that substantially obviates one or more of the problems due to limitations and disadvantages of the related art.

An advantage of the present invention is to provide a gas distribution plate and a substrate treating apparatus including the same which can improve uniformity of a thin film and production efficiency.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a gas distribution plate that is installed in a chamber providing a reaction space and supplies a reaction gas onto a substrate placed on a substrate placing plate, wherein the gas distribution plate includes: first and second surfaces opposing to each other, wherein the second surface faces the substrate placing plate and has a recess shape; and a plurality of injection holes each including: an inflow portion that extends from the first surface toward the second surface; a diffusing portion that extends from the second surface toward the first surface; and an orifice portion between the inflow portion and the diffusing portion, wherein the plurality of inflow portions of the plurality of injection holes decrease in gas path from edge to middle of the gas distribution plate, and wherein the plurality of diffusing portions of the plurality of injection holes have substantially the same gas path.

In another aspect, a substrate treating apparatus includes a chamber providing a reaction space; a substrate placing plate in the reaction space, wherein a substrate is placed on the substrate placing plate; and a gas distribution plate in the reaction space, the gas distribution plate including: first and second surfaces opposing to each other, wherein the second surface faces the substrate placing plate and has a recess shape; and a plurality of injection holes each including: an inflow portion that extends from the first surface toward the second surface; a diffusing portion that extends from the second surface toward the first surface; and an orifice portion between the inflow portion and the diffusing portion, wherein the plurality of inflow portions of the plurality of injection holes decrease in gas path from edge to middle of the gas distribution plate, and wherein the plurality of diffusing portions of the plurality of injection holes have substantially the same gas path.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 3:
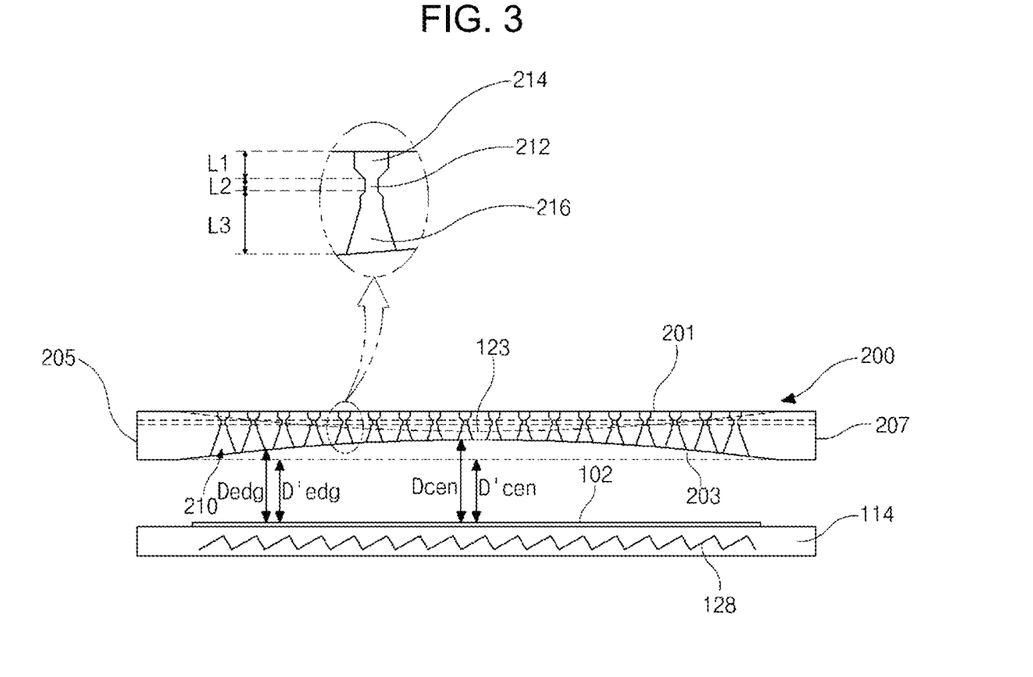
FIG. 3 is a cross-sectional view illustrating a gas distribution plate and a substrate placing plate of a substrate treating apparatus according to a first embodiment of the present invention.
Figure 4:
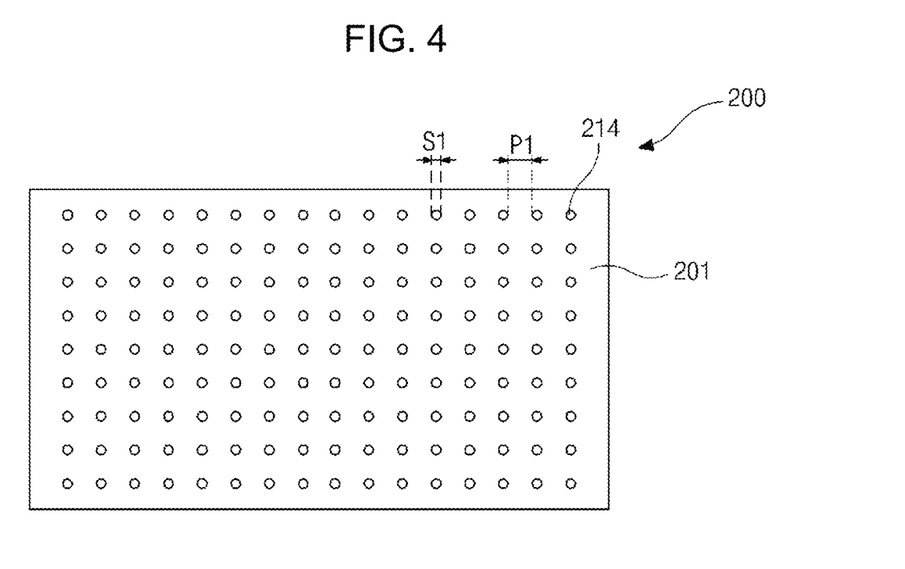
FIGS. 4 and 5 are plan views illustrating top and bottom surfaces, respectively, of the gas distribution plate according to the first embodiment of the present invention.
Figure 5:
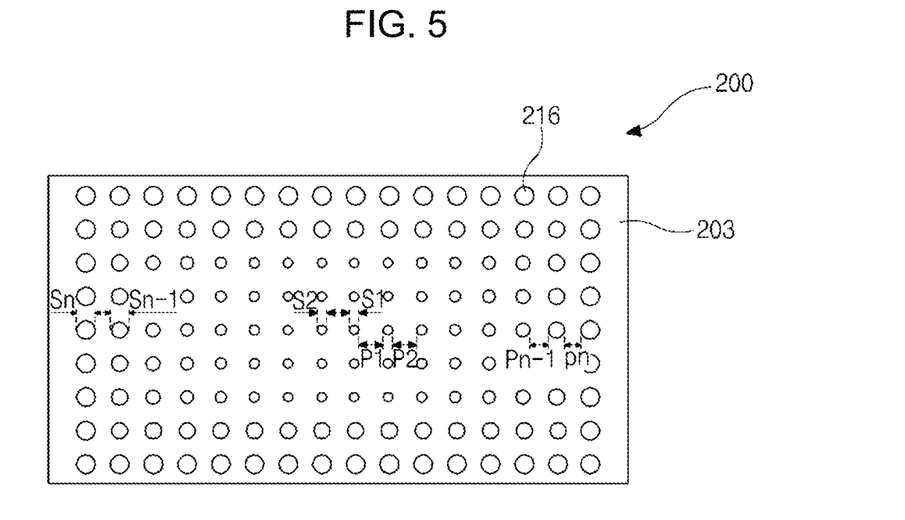

FIG. 3 is a cross-sectional view illustrating a gas distribution plate and a substrate placing plate of a substrate treating apparatus according to a first embodiment of the present invention, FIGS. 4 and 5 are plan views illustrating top and bottom surfaces, respectively, of the gas distribution plate according to the first embodiment of the present invention.

Referring to FIGS. 3 to 5, the gas distribution plate 200 of the substrate treating apparatus according to the first embodiment includes a first surface 201 referred to as a top surface, a second surface 203 referred to as a bottom surface, and first and second side surfaces 205 and 207. The first surface 201 may be parallel with the substrate placing plate 114. The second surface 203 faces the substrate placing plate 114 and has a recess shape, for example, a concave recess shape. The gas distribution plate 200 have a plurality of injection holes 210 to inject a reaction gas toward a substrate 102 placed on the substrate placing plate 114. The gas distribution plate 200 and the substrate placing plate 114 are located in a chamber (not shown) providing a reaction space (not shown). The gas distribution plate 200 and the substrate placing plate 114 may have substantially the same shape in plane, for example, a circular or rectangular shape.

Each injection hole 210 may include an inflow portion 214, an orifice portion 212 and a diffusing portion 216. The inflow portion 214 and the diffusing portion 216 function as an inlet and an outlet of the injection hole 210, respectively.

The inflow portion 214 extends from the first surface 201 toward the second surface 203. The reaction gas supplied from outside flows into the inflow portion 214. The orifice portion 212 is communicated with the inflow portion 214 and may have a diameter less than a diameter of the inflow portion 214. The diffusing portion 216 is communicated with the orifice portion 212, extends to the second surface 203, and supplies the reaction gas toward the substrate placing plate 114. The plurality of injection holes 210 may be uniformly distributed at substantially the same interval over the gas distribution plate 200.

In order to deposit or etch a thin film on the substrate 102, the reaction gas is supplied to the reaction space in the chamber, and a temperature inside the chamber increases to about 200 or 500 degrees in Celsius. Accordingly, the gas distribution plate 200 is thermally expanded and weighs down under the weight of the gas distribution plate 200. As described in the related art, if the gas distribution plate is planar, the distance between the gas distribution plate and the substrate placing plate is not uniform and decreases from edge to middle.

However, the gas distribution plate 200 of the first embodiment has the concave recess shape at the second surface 203 in order to compensate for the distance non-uniformity due to the weigh down of the gas distribution plate 200. In other words, before depositing or etching the thin film on the substrate 102, the distance between the gas distribution plate 200 and the substrate placing plate 114 increases from edge to middle. For example, the distance Dedg at edge is less than the distance Dcen at middle. Then, when depositing or etching the thin film on the substrate 102 is performed, the weigh down of the gas distribution plate 200 is caused due to the thermal expansion of the gas distribution plate 200. However, the second surface 203 has the concave recess shape in advance consideration of the weigh down of the gas distribution plate 200. Accordingly, even though the gas distribution plate 200 weighs down, the structure having the concave recess shape of the second surface 203 can compensate for the non-uniform distance due to the weigh down. Therefore, the distance between the gas distribution plate 200 and the substrate placing plate 114 can be substantially entirely uniform. For example, the distance D'edg at edge during treating the substrate 102 is substantially the same as the distance D'cen at middle during treating the substrate 102.

The second surface 203 may be formed, for example, by preparing a gas distribution plate having a planar second surface, and then processing a planar second surface to form the concave second surface 203 in consideration of a curvature of the planar second surface downwardly protruded due to the thermal expansion based upon experiment or simulation. When the planar second surface is processed, a volume of the planar second surface downwardly protruded due to the thermal expansion is also considered.

Since the second surface 203 is formed to have the concave recess shape, thickness of the gas distribution plate 200 decreases from edge to middle. When the gas distribution plate 200 is thermally expanded, the distance between the gas distribution plate 200 and the substrate placing plate 114 is uniform, but a sunken portion 123 is made at the first surface 201. However, the sunken portion 123 substantially does not influence injection of the reaction gas through the injection holes 210.

As described above, the second surface 203 functions to make the uniform distance between the gas distribution plate 200 and the substrate placing plate 114, this causes uniform density of the reaction gas and the plasma in the reaction space to be improved. However, due to the diffusing portions 216, density of the reaction gas may be varied according to position.

In more detail, diameter of the diffusing portion 216 increases from the orifice 212 to the second surface 203. For example, the diffusing portion 216 has a truncated cone shape. The plurality of inflow portions 214 have substantially the same height i.e., substantially the same first gas path L1, and the plurality of orifice portions 212 have substantially the same height i.e., substantially the same second gas path L2. However, the plurality of diffusing portions 216 have different third gas paths L3 from one another because of the concave second surface 203. In other words, the third gas paths L3 decrease from edge to middle because of the concave second surface 203. Further, since each diffusing portion 216 has the truncated cone shape, the plurality of diffusing portions 216 have different diameters from one another. In other words, the diameters of the diffusion portions 216 decrease from edge to middle.

The inflow portion 214 adjusts a gas flow rate and a gas flow amount of the reaction gas by the orifice portion 212. The diffusing portion 216, which has the diameter more than the orifice portion 212, functions to diffuse the reaction gas passing through the inflow portion 214 and the orifice portion 212 and uniformly inject the reaction gas onto the substrate 102. The reaction gas supplied onto the substrate 102 is proportional to the diameter of the orifice portion 212 and the volume of the diffusing portion 216. The plurality of inflow portions and orifice portions 214 and 212 have substantially the same first and second gas paths L1 and L2, respectively. However, the plurality of diffusing portions 216 have the different third gas paths L3 and volumes from one another. Accordingly, injection amounts of the reaction gases from the plurality of diffusing portions 216 are different from one another. In other words, the injection amounts decrease from edge to middle.

Referring to FIG. 4, the plurality of inflow portions 214 at the first surface 201 of the gas distribution plate 200 have substantially the same diameter S1 and are spaced apart from one another at substantially the same interval P1. Referring to FIG. 5, the plurality of diffusing portions 216 have different diameters S1, . . . , Sn and spaced apart from one another at different intervals P1, . . . , Pn. For example, the diameters of the diffusing portions 216 increase from middle to edge, and the intervals between the diffusing portions 216 decrease from middle to edge.

Accordingly, even though the concave second surface 203 compensates for the non-uniform distance due to the weigh down of the gas distribution plate 200, since the diffusing portions 216 have the different gas paths and volumes, the injection amounts of the reaction gas increase from middle to edge. Therefore, density of the reaction gas between the gas distribution plate 200 and the substrate placing plate 114 is not uniform, thus uniformly depositing or etching the thin film on the substrate 102 is difficult.

To solve this problem, a second embodiment is provided as follows.

Figure 6:
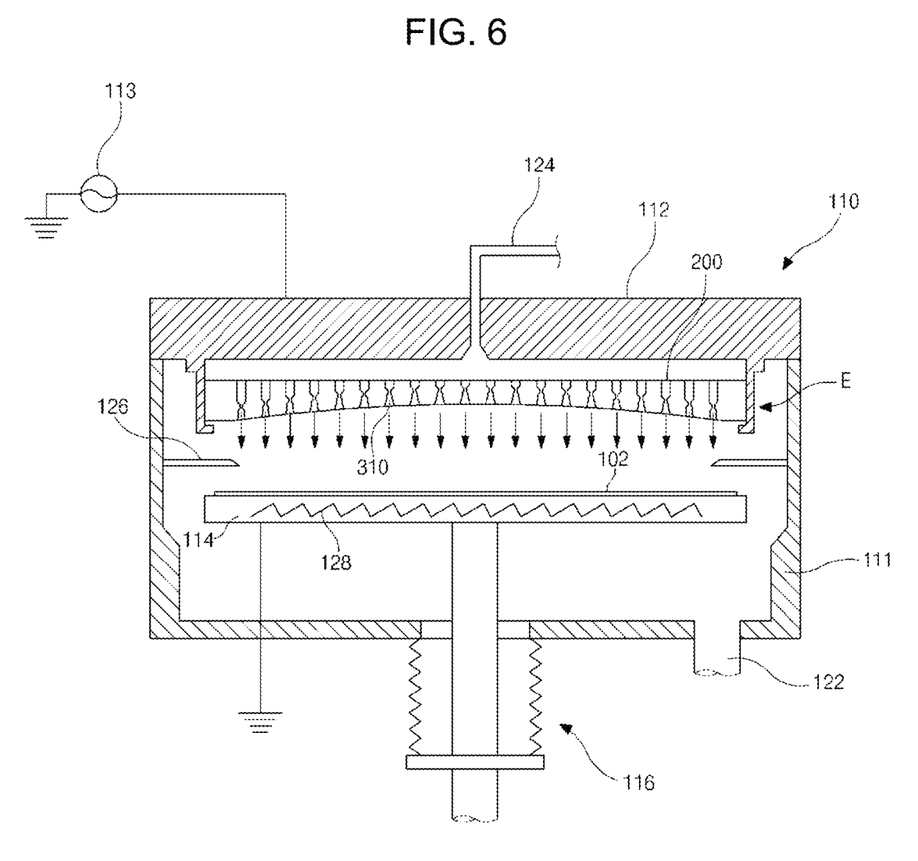
FIG. 6 is a cross-sectional view illustrating a substrate treating apparatus according to the second embodiment of the present invention.
Figure 7:
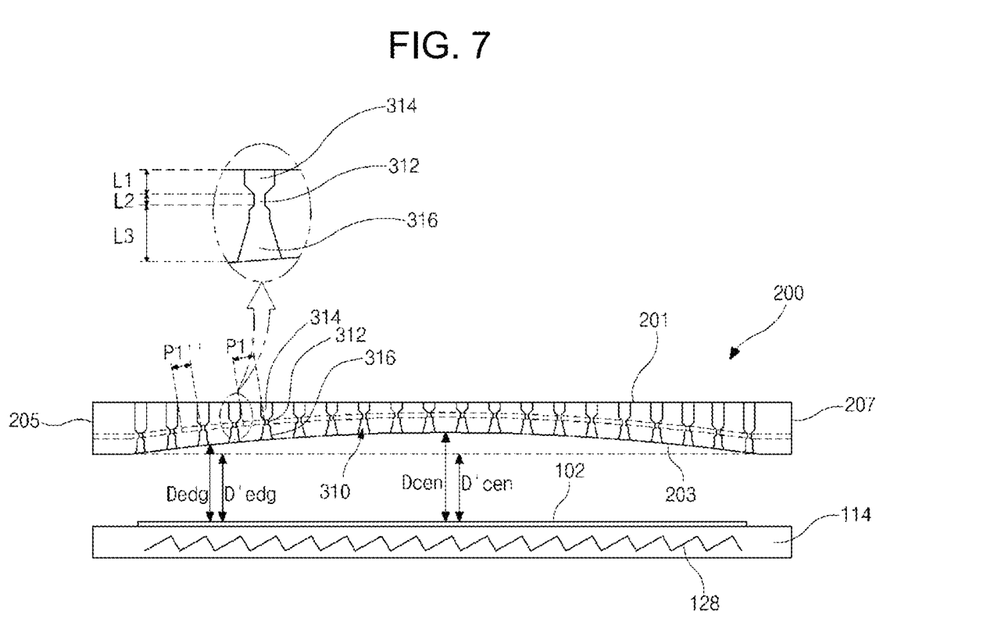
FIG. 7 is a cross-sectional view illustrating a gas distribution plate and a substrate placing plate according to the second embodiment of the present invention.
Figure 8:
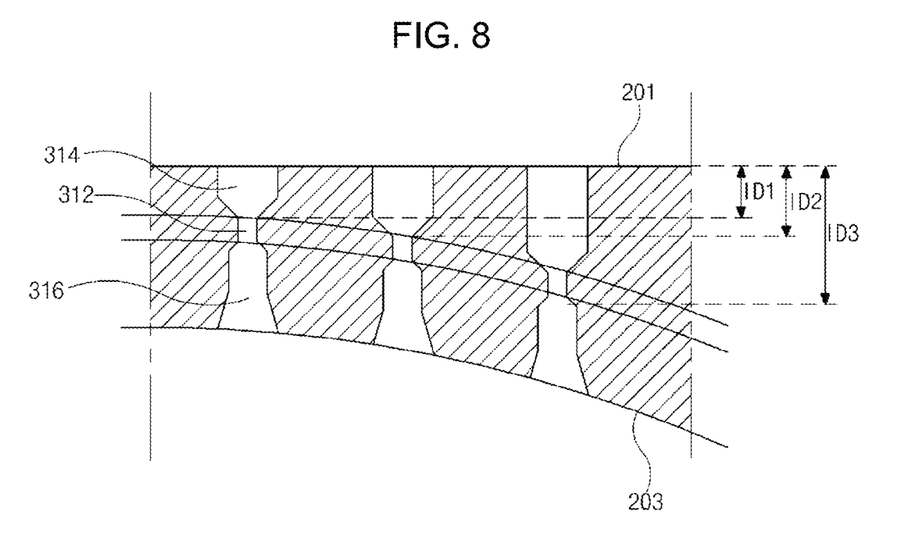
FIG. 8 is a cross-sectional view enlarging a portion of the gas distribution plate according to the second embodiment of the present invention.
Figure 9:
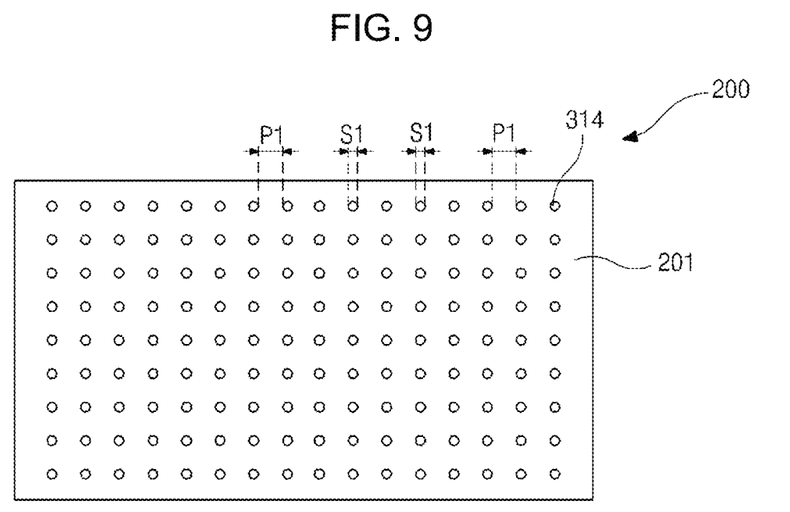
FIGS. 9 and 10 are cross-sectional views illustrating top and bottom surfaces, respectively, of the gas distribution plate according to the second embodiment of the present invention.
Figure 10:
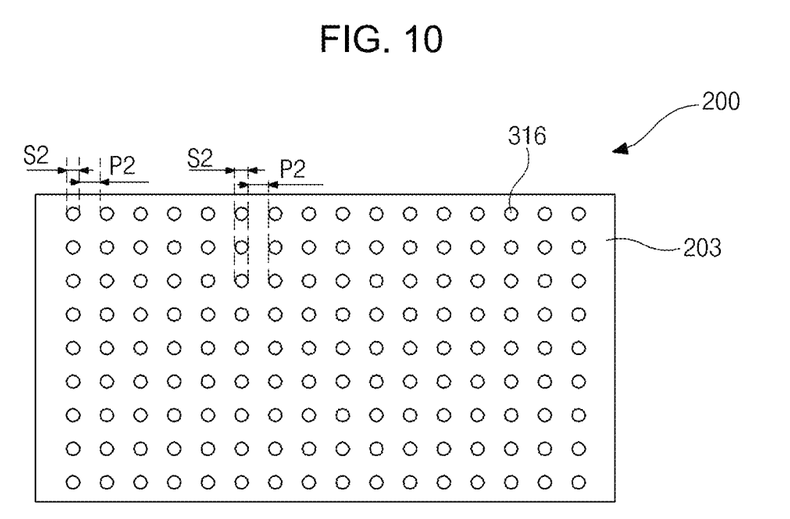

FIG. 6 is a cross-sectional view illustrating a substrate treating apparatus according to the second embodiment of the present invention, FIG. 7 is a cross-sectional view illustrating a gas distribution plate and a substrate placing plate according to the second embodiment of the present invention, FIG. 8 is a cross-sectional view enlarging a portion of the gas distribution plate according to the second embodiment of the present invention, FIGS. 9 and 10 are cross-sectional views illustrating top and bottom surfaces, respectively, of the gas distribution plate according to the second embodiment of the present invention. Explanations of parts similar to parts of the first embodiment may be omitted.

Referring to FIGS. 6 to 10, the substrate treating apparatus 110 according to the second embodiment includes a chamber 111 including a chamber lid 112 and providing a reaction space E therein. The substrate placing plate 114 is located in the reaction space E, and a substrate 102 is placed on the substrate placing plate 114. A heater 128 is installed in the substrate placing plate 114 to heat the substrate 102. The gas distribution plate 200 supplies the reaction gas toward the substrate placing plate 114. An edge frame 126 is fitted onto an inner wall of the chamber 111 and functions to prevent a thin film from depositing at peripheral regions of the substrate 102. A gas supply pipe 124 supplies the reaction gas. An exhaust port 122 adjusts the reaction gas of the reaction space E and vacuum of the reaction space E.

The chamber lid 112 connected to a RF (radio frequency) voltage source 113, and the substrate placing plate 114 connected to a ground terminal function as an upper electrode and a lower electrode, respectively. Accordingly, the chamber lid 112 and the substrate placing plate 114 function to activate the reaction gas when the reaction gas flows into the reaction space E.

The gas distribution plate 200 includes a plurality of injection holes 310. The gas distribution plate 200 is coupled with the chamber lid 112, and an accommodating space is formed between the gas distribution plate 200 and the chamber lid 112 and functions to accommodate the reaction gas supplied from the gas supply pipe 124. The substrate placing plate 114 moves down to load/unload the substrate 102, and moves up to form or etch a thin film on the substrate 102. In other words, the substrate placing plate 114 is configured such that it moves up and down.

The edge frame 126 is fixed into the inner wall of the chamber 111. The edge frame 126 shields the peripheral regions of the substrate 102 when the substrate placing plate 114 moves up, thus formation of thin film at the peripheral regions of the substrate 102 is prevented.

The gas supply pipe 124 is installed such that it passes through a middle portion of the chamber lid 112. A baffle (not shown) is installed at a location of the accommodating space corresponding to the gas supply pipe 124 and functions to uniformly distribute the reaction gas from the gas supply pipe 124. The exhaust port 122 is coupled with a vacuum pump (not shown) so that the reaction gas of the reaction space E is exhausted or vacuum of the reaction space E is adjusted.

The gas distribution plate 200 includes a first surface 201 referred to as a top surface, a second surface 203 referred to as a bottom surface, and first and second side surfaces 205 and 207. The first surface 201 may be parallel with the substrate placing plate 114. The second surface 203 faces the substrate placing plate 114 and has a recess shape, for example, a concave recess shape.

The gas distribution plate 200 have a plurality of injection holes 310 to inject the reaction gas onto the substrate 102 placed on the substrate placing plate 114. The gas distribution plate 200 and the substrate placing plate 114 are located in the reaction space E. The gas distribution plate 200 and the substrate placing plate 114 may have substantially the same shape in plane, for example, a circular or rectangular shape.

Each injection hole 310 may include an inflow portion 314, an orifice portion 312 and a diffusing portion 316. The inflow portion 314 and the diffusing portion 316 function as an inlet and an outlet of the injection hole 310, respectively.

The inflow portion 314 extends from the first surface 201 toward the second surface 203. The reaction gas supplied from outside flows into the inflow portion 314. The orifice portion 312 is communicated with the inflow portion 314 and may have a diameter less than a diameter of the inflow portion 314. The diffusing portion 316 is communicated with the orifice portion 312, extends to the second surface 203 and injects the reaction gas onto the substrate placing plate 114. The plurality of injection holes 310 may be distributed at substantially the same interval over the gas distribution plate 200.

Before treating the substrate 102 is performed, the distance between the gas distribution plate 200 and the substrate placing plate 114 increases from edge to middle. For example, the distance Dedg at edge is less than the distance Dcen at middle. Then, when treating the substrate 102 is performed, the gas distribution plate 200 weighs down, thus the distance between the gas distribution plate 200 and the substrate placing plate 114 becomes uniform. For example, the distance D'edg at edge during treating the substrate 102 is substantially the same as the distance D'cen at middle during treating the substrate 102.

The inflow portion 314 has a diameter of about several micrometers and adjusts a gas flow rate and a gas flow amount by the orifice portion 312. The diffusing portion 316, which has the diameter more than the orifice portion 312, functions to diffuse the reaction gas passing through the inflow portion 314 and the orifice portion 312 and uniformly inject the reaction gas onto the substrate 102. The reaction gas supplied onto the substrate 102 is proportional to the diameter of the orifice portion 312 and the volume of the diffusing portion 316. In the second embodiment, the plurality of diffusing portions 316 have substantially the same volume so that the reaction gas is uniformly distributed onto the substrate 102.

The inflow portion 314 extends from the first surface 210 to the corresponding orifice portion 312. The plurality of orifice portions 312 are arranged in substantially the same shape as the concave shape of the second surface 203. Accordingly, heights of the inflow portions 314 increase from middle to edge. Referring to FIG. 8, three neighboring inflow portions 314 have three heights i.e., three gas paths ID1 to ID3, respectively, different from one another. In other words, the first gas paths L1 of the inflow portions 314 tends to increase from middle to edge, ID1<ID2<ID3.

The plurality of orifice portions 312 and the plurality of diffusing portions 316 are arranged in parallel with the second surface 203. Accordingly, the plurality of orifice portions 312 have substantially the same second gas path L2, and the plurality of diffusing portions 316 have substantially the same third gas path L3.

Referring to FIG. 9, the plurality of inflow portions 214 have substantially the same diameter S1 and are spaced apart from one another at substantially the same interval P1, when the plurality of inflow portions 214 are viewed with respect to the first surface 201. However, referring to FIG. 7, when the plurality of inflow portions 214 are viewed with respect to the second surface 203, it appears that the plurality of inflow portions 214 are spaced apart from one another at different intervals, for example, different intervals P1' and P1".

Referring to FIG. 10, when the plurality of diffusing portions 316 are viewed with respect to the second surface 203, the plurality of diffusing portions 316 have substantially the same diameter S2 and are spaced apart from one another at substantially the same interval P2. Since a cross-section of the concave second surface 203 has, for example, an elliptical arc shape, and a central axis of each diffusing portion 316 is perpendicular to the substrate placing plate 114, areas of the diffusing portions 316 viewed from the second surface 203 may minutely increase from middle to edge. However, this minute increase substantially does not influence variation of an amount of the reaction gas injected from the diffusing portion 316. Accordingly, it is considered that the plurality of diffusing portions 316 have substantially the same diameter S2 and are spaced apart from one another at substantially the same interval P2.

As described above, in the second embodiment, when the gas distribution plate 200 weighs down due to the thermal expansion, since the second surface 203 has the concave recess shape, non-uniformity of the distance between the gas distribution plate 200 and the substrate placing plate 114 can be compensated for. Further, since the plurality of diffusing portions 316 have substantially the same gas path L3, diameter S2 and volume, the reaction gas can be uniformly distributed all over the substrate 102.

While the first and second embodiments provide the gas distribution plate having the concave second surface, a following third embodiment provides a gas distribution plate having a stepped second surface.

Figure 11:
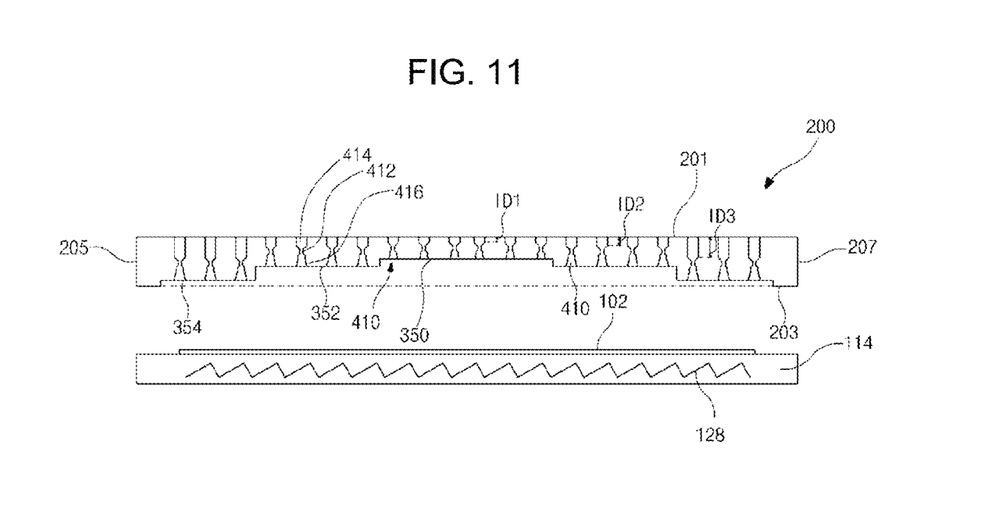
FIG. 11 is a cross-sectional view illustrating a gas distribution plate of a substrate treating apparatus according to the third embodiment of the present invention.
Figure 12:
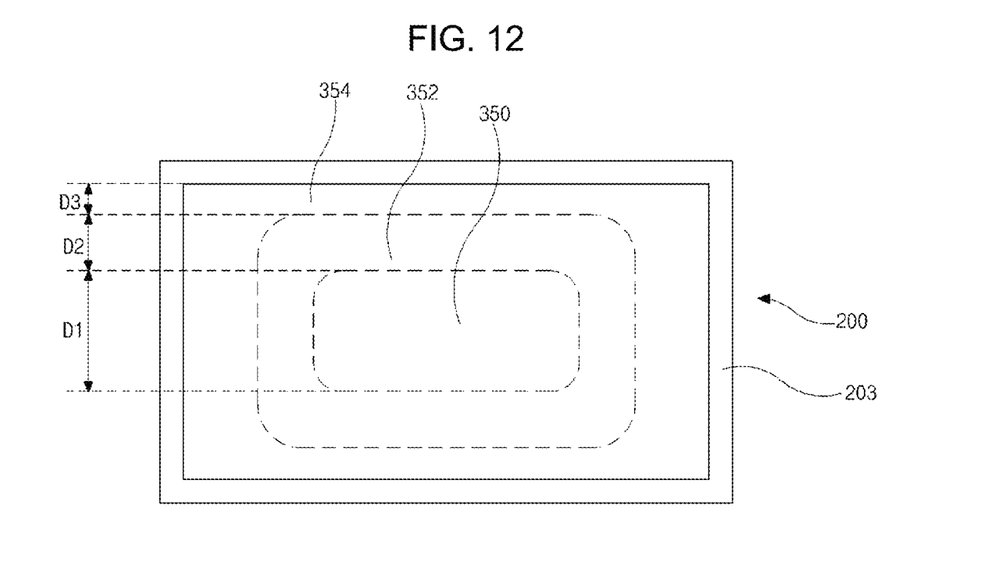
FIG. 12 is a plan view illustrating a second surface of the gas distribution plate according to the third embodiment of the present invention.

FIG. 11 is a cross-sectional view illustrating a gas distribution plate of a substrate treating apparatus according to the third embodiment of the present invention, and FIG. 12 is a plan view illustrating a second surface of the gas distribution plate according to the third embodiment of the present invention. Explanations of parts similar to parts of the first and second embodiment may be omitted.

Referring to FIGS. 10 and 11, the gas distribution plate 200 of the substrate treating apparatus according to the third embodiment includes a first surface 201 referred to as a top surface, a second surface 203 referred to as a bottom surface, and first and second side surfaces 205 and 207. The first surface 201 may be parallel with a substrate placing plate 114. The second surface 203 faces the substrate placing plate 114 and has a recess shape, for example, a stepped recess shape. The gas distribution plate 200 have a plurality of injection holes 410 to inject a reaction gas toward a substrate 102 placed on the substrate placing plate 114. The gas distribution plate 200 and the substrate placing plate 114 are located in a chamber providing a reaction space. The gas distribution plate 200 and the substrate placing plate 114 may have substantially the same shape in plane, for example, a circular or rectangular shape.

The second surface 203 may include a plurality of steps, and a number of the steps is not limited. In the third embodiment, it is assumed that the second surface 203 includes three steps in a radial direction, for example, from middle to edge.

The second surface 203 includes a first step portion 350 at middle, a second step portion 352 surrounding the first step portion 350, and a third step portion 354 surrounding the second step portion 352 and located at edge. A relationship between a first width D1 of the first step portion 350, a second width D2 of the second step portion 352, and a third width of the third step portion 354 is D1>D2>D3. A thickness of the first step portion 350 is less than a thickness of the second step portion 352, and the thickness of the second step portion 352 is less than a thickness of the third step portion 354. The step portions 350, 352 and 354 increases in thickness from middle to edge.

It is preferred that the first to third step portions 350, 352 and 354 are configured such that a center of the first step portion 350, a center of the second step portion 352 and a center of the third step portion 354 are substantially passed by, for example, the elliptical arc in cross-section of the second surface of the first and second embodiments. The second and third step portions 352 and 354 are configured concentrically around the first step portion 350. Since the centers of the first to third step portions 352 and 354 corresponds to the elliptical arc, an area of the first step portion 350 is more than an area of the second step portion 352, and the area of the second step portion 352 is more than an area of the third step portions 354.

Each injection hole 410 may include an inflow portion 414, an orifice portion 412 and a diffusing portion 416. The inflow portion 414 and the diffusing portion 416 function as an inlet and an outlet of the injection hole 410, respectively.

The inflow portion 414 extends from the first surface 201 toward the second surface 203. The reaction gas supplied from outside flows into the inflow portion 414. The orifice portion 412 is communicated with the inflow portion 414 and may have a diameter less than a diameter of the inflow portion 414. The diffusing portion 416 is communicated with the orifice portion 412, extends to the second surface 203 and injects the reaction gas onto the substrate placing plate 114. The plurality of injection holes 410 may be distributed at substantially the same interval over the gas distribution plate 200.

The inflow portion 414 extends from the first surface 210 to the corresponding orifice portion 412. The plurality of orifice portions 412 are arranged in substantially the same shape as the stepped shape of the second surface. Accordingly, the plurality of inflow portions 414 are divided into three groups, first to third groups corresponding to the first to third step portions 350, 352 and 354, respectively. The first to third groups have three heights i.e., three gas paths ID1 to ID3, respectively, different from one another. In other words, the first gas paths of the inflow portions 314 tend to increase from middle to edge, ID1<ID2<ID3. The orifice portions 414 of the first group have substantially the same gas path ID1, the orifice portions 414 of the second group have substantially the same gas path ID2, and the orifice portions 414 of the third group have substantially the same gas path ID3.

The plurality of orifice portions 412 and the plurality of diffusing portions 416 are arranged in parallel with the second surface 203. Accordingly, the plurality of orifice portions 412 have substantially the same second gas path, and the plurality of diffusing portions 416 have substantially the same third gas path.

The injection hole 418 adjusts a gas flow rate and a gas flow amount by the orifice portion 412. The diffusing portion 416, which has the diameter more than the orifice portion 412, functions to diffuse the reaction gas passing through the inflow portion 414 and the orifice portion 412 and uniformly inject the reaction gas onto the substrate 102. The reaction gas supplied onto the substrate 102 is proportional to the diameter of the orifice portion 412 and the volume of the diffusing portion 416. In similar to the second embodiment, in the third embodiment, the plurality of diffusing portions 416 have substantially the same volume so that the reaction gas is uniformly distributed on the substrate 102.

In the third embodiment, in order to simplify manufacturing the gas distribution plate 200, the first to third step portions 350, 352 and 354 may be manufactured separately from one another and then be assembled with one another. When the first to third portions 350, 352 and 354 are manufactured separately, production time and cost can be reduced.

As described in the above embodiments, since the bottom surface of the gas distribution plate have the recess shape, the uniform distance between the gas distribution plate and the substrate placing plate can be obtained even though the thermal expansion occurs, and uniformity of the reaction gas and plasma can be improved.

Further, when the plurality of diffusing portions have substantially the same gas path, the reaction gas can be uniformly supplied onto the substrate. Accordingly, uniformly depositing and etching the thin film on the substrate can be performed.

Further, when the bottom surface of the gas distribution plate has the stepped shape, the manufacturing process of the gas distribution plate can be simplified.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A gas distribution plate that is installed in a chamber providing a reaction space and supplies a reaction gas onto a substrate placed on a substrate placing plate, the gas distribution plate comprising:

first and second surfaces opposite to each other, wherein the second surface faces the substrate placing plate and has a recess; and a plurality of injection holes each including:
an inflow portion that extends from the first surface toward the second surface;
a diffusing portion that extends from the second surface toward the first surface; and
an orifice portion between the inflow portion and the diffusing portion, wherein heights of the plurality of inflow portions in a gas path direction decrease from an edge portion to a center portion of the gas distribution plate, and wherein the plurality of diffusing portions of the plurality of injection holes have substantially the same dimensions in the gas path direction.

2. The gas distribution plate according to claim 1, wherein a distance between the second surface and the substrate placing plate decreases from middle to edge of the gas distribution plate.

3. The gas distribution plate according to claim 1, wherein the first surface is planar and parallel with the substrate placing plate.

4. The gas distribution plate according to claim 1, wherein the plurality of inflow portions are arranged at substantially the same interval therebetween with respect to a plane of the gas distribution plate, and the plurality of inflow portions are arranged at intervals therebetween, which increase from middle to edge of the gas distribution plate, with respect to the second surface.

5. The gas distribution plate according to claim 1, wherein the plurality of orifice portions of the plurality of injection holes have substantially the same dimension in the gas path direction and are arranged in parallel with the second surface.

6. The gas distribution plate according to claim 1, wherein the plurality of diffusing portions have substantially the same diameter and volume, and are arranged at substantially the same interval therebetween and in parallel with the second surface.

7. The gas distribution plate according to claim 1, wherein a center axis of the diffusing portion is perpendicular to the substrate placing plate.

8. The gas distribution plate according to claim 1, wherein the diffusing portion has a cone shape truncated at top thereof.

9. The gas distribution plate according to claim 1, wherein the recess shape of the second surface has an elliptical arc shape in cross-section.

10. The gas distribution plate according to claim 1, wherein the second surface includes a plurality of step portions.

11. The gas distribution plate according to claim 10, wherein the plurality of step portions are configured concentrically around middle of the gas distribution plate.

12. The gas distribution plate according to claim 10, wherein the plurality of step portions are more recessed from edge to middle of the gas distribution plate.

13. The gas distribution plate according to claim 10, wherein the plurality of inflow portions are divided into a plurality of groups corresponding to the plurality of step portions, respectively, and the dimensions in the gas path direction of inflow portions between the plurality of groups are different.

14. The gas distribution plate according to claim 10, wherein the plurality of inflow portions are divided into a plurality of groups corresponding to the plurality of step portions, respectively, and the dimensions in the gas path direction of the inflow portions within each of the plurality of groups are substantially the same.

15. A substrate treating apparatus, comprising:
a chamber providing a reaction space;
a substrate placing plate in the reaction space, wherein a substrate is placed on the substrate placing plate; and
a gas distribution plate in the reaction space, the gas distribution plate including:
first and second surfaces opposing to each other, wherein the second surface faces the substrate placing plate and has a recess shape; and
a plurality of injection holes each including:
an inflow portion that extends from the first surface toward the second surface;
a diffusing portion that extends from the second surface toward the first surface; and
an orifice portion between the inflow portion and the diffusing portion, wherein dimensions in a gas path direction of the plurality of inflow portions of the plurality of injection holes decrease from edge to middle of the gas distribution plate, and wherein the plurality of diffusing portions of the plurality of injection holes have substantially the same dimensions in the gas path direction.

16. The apparatus according to claim 15, wherein the recess shape of the second surface has an elliptical arc shape or a plurally stepped shape.

17. A gas distribution plate configured to supply a reaction gas to a substrate placed on a substrate placing plate in a chamber providing a reaction space, the gas distribution plate comprising:
first and second surfaces arranged opposite to each other, wherein the second surface is configured to face the substrate placing plate when arranged in the chamber; and
a recess formed along the second surface such that the gas distribution plate is narrower toward a center thereof and thicker toward edges thereof;
a plurality of injection holes extending through the gas distribution plate from the first surface to the second surface, each injection hole including:
an inflow portion having a length that extends from the first surface toward the second surface;
a diffusing portion having a length that extends from the second surface toward the first surface; and
an orifice portion having a length that extends between the inflow portion and the diffusing portion,
wherein lengths of the inflow portions of the plurality of injection holes decrease from an edge portion to a center portion of the gas distribution plate, and wherein lengths of each of the diffusing portions of the plurality of injection holes are substantially the same.

18. The gas distribution plate according to claim 17, wherein a distance between the second surface and the substrate placing plate decreases from the center portion to the edge portion of the gas distribution plate when arranged in the chamber.

19. The gas distribution plate according to claim 17, wherein the first surface is substantially planar and is configured to be arranged substantially parallel with the substrate placing plate when both are positioned in the chamber.

20. A substrate treating apparatus, comprising:
a chamber providing a reaction space;
a substrate placing plate disposed in the reaction space, wherein the substrate placing plate is configured to receive a substrate on a top surface of the substrate placing plate; and
a gas distribution plate arranged in the reaction space, the gas distribution plate including:
first and second surfaces arranged opposite to each other, wherein the second surface faces the substrate placing plate and has a shape recessed toward the first surface; and
a plurality of injection holes arranged through the gas distribution plate, each injection hole including:
an inflow portion that extends for a length from the first surface toward the second surface;
a diffusing portion that extends for a length from the second surface toward the first surface; and
an orifice portion extending between the inflow portion and the diffusing portion, wherein the lengths of one or more of the inflow portions of the plurality of injection holes near a center portion of the gas distribution plate are shorter than the lengths of one or more of the inflow portions of the plurality of injection holes near an edge portion thereof, and wherein the lengths of the diffusing portions of the plurality of injection holes are substantially the same.

* * * * *